(12) United States Patent
Sommer

(10) Patent No.: US 7,274,218 B2
(45) Date of Patent: Sep. 25, 2007

(54) INTEGRATED CIRCUIT

(75) Inventor: Michael Bernhard Sommer, Raubling (DE)

(73) Assignee: Infineon Technologies, AG, Neubiberg (DE)

(*) Notice: Subject to any disclaimer, the term of this patent is extended or adjusted under 35 U.S.C. 154(b) by 175 days.

(21) Appl. No.: 11/135,642

(22) Filed: May 24, 2005

(65) Prior Publication Data

US 2005/0280441 A1    Dec. 22, 2005

(30) Foreign Application Priority Data

May 27, 2004  (DE) ............... 10 2004 025 913

(51) Int. Cl.
*H03K 19/094*  (2006.01)
(52) U.S. Cl. .................. 326/83; 326/62; 326/63
(58) Field of Classification Search ............ 326/83
See application file for complete search history.

(56) References Cited

U.S. PATENT DOCUMENTS

| | | | | |
|---|---|---|---|---|
| 3,377,548 A | * | 4/1968 | Newbold | ............... 323/303 |
| 3,530,389 A | * | 9/1970 | Hogan et al. | ............... 330/9 |
| 5,214,320 A | * | 5/1993 | Truong | ............... 326/27 |
| 6,194,920 B1 | * | 2/2001 | Oguri | ............... 327/563 |
| 2006/0267681 A1 | * | 11/2006 | Sommer | ............... 330/1 A |

* cited by examiner

*Primary Examiner*—Shuwang Liu
*Assistant Examiner*—Crystal Hammond
(74) *Attorney, Agent, or Firm*—Edell, Shapiro & Finnan, LLC

(57) ABSTRACT

An integrated circuit includes a first and a second amplifier circuit (10, 20), which are in each case driven by an input signal (Vin) having a high and a low signal level and a reference signal (Vref) having a constant signal level and, on the output side (D11, D21) generate a first control signal (S1) and a second control signal (S2). The control signals (S1, S2) are generated independently of one another and are used to regulate a first controllable resistor (31) and a second controllable resistor (32) of a third amplifier circuit (30). Depending on the resistance value of the first and second controllable resistors (31, 32) of the third amplifier circuit, an output signal (Vout) that is amplified in comparison with the input signal (Vin) can be generated at an output terminal (A). The integrated circuit can be used as an input amplifier of an integrated semiconductor memory and permits an adaptive behavior of the input amplifier with regard to fluctuations of the average absolute input signal level.

18 Claims, 10 Drawing Sheets

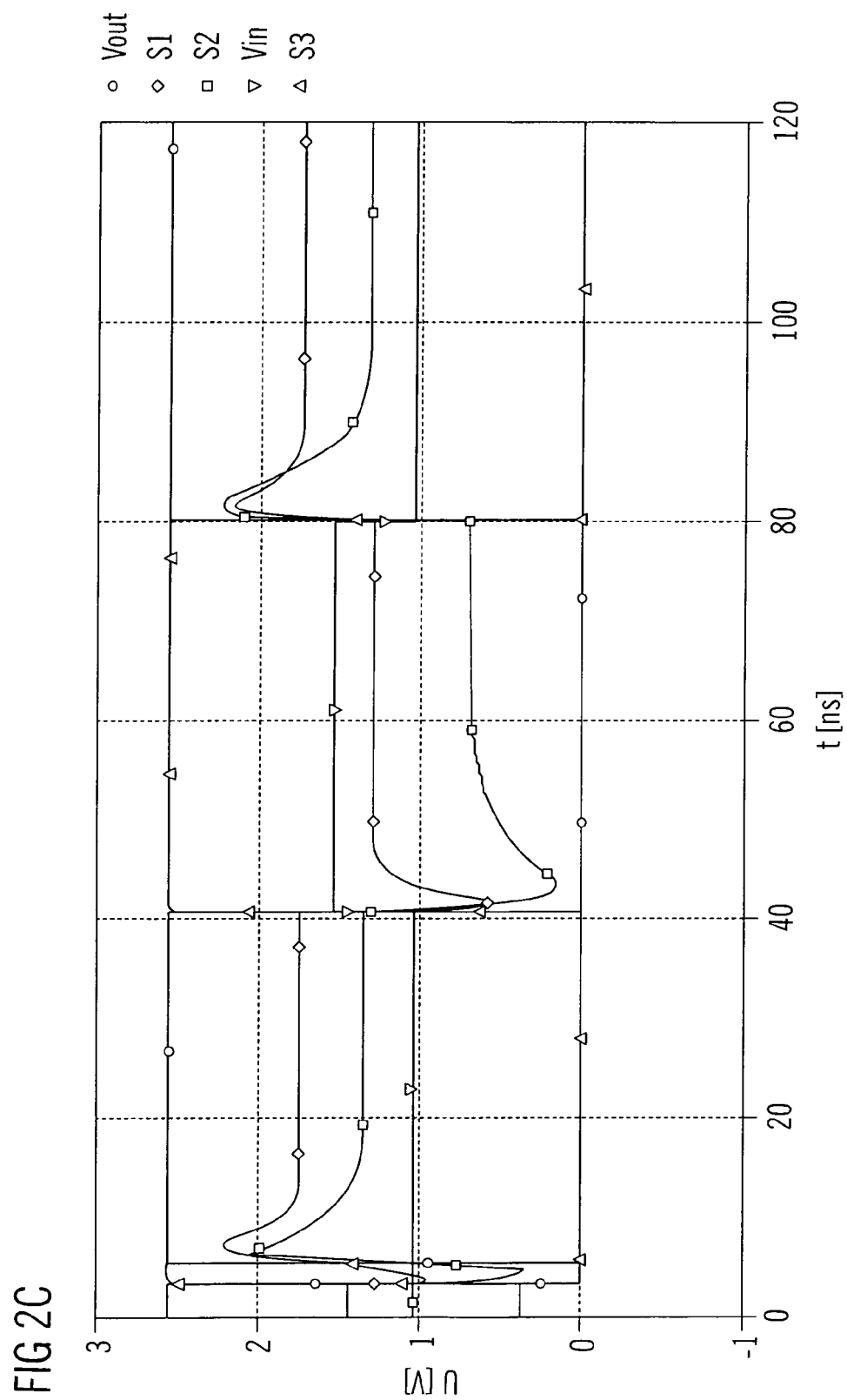

INTEGRATED CIRCUIT

CROSS REFERENCE TO RELATED APPLICATIONS

This application claims priority under 35 U.S.C. § 119 to German Application No. DE 10 2004 025913.5, filed on May 27, 2004, and titled "Integrated Circuit," the entire contents of which are hereby incorporated by reference.

FIELD OF THE INVENTION

The invention relates to an integrated circuit for amplifying an input signal.

BACKGROUND

In many computer-aided applications it is necessary to exchange data between two integrated chips situated on the motherboard of a computer. Thus, by way of example, data has to be transferred bidirectionally between the processor and an integrated semiconductor memory, for example a DRAM (dynamic random access memory) semiconductor memory. In order to store data signals that are transferred from the processor to the DRAM memory via a databus in memory cells of the integrated semiconductor memory, the incoming data signals have to be amplified by the integrated semiconductor memory prior to further processing.

For this purpose, the integrated semiconductor memory generally has an input amplifier that amplifies incoming data signals to a defined level. The bit lines connected to the memory cells are driven with this amplified level. For example, in an integrated semiconductor memory having a low voltage level of 1 V for an incoming data signal, the voltage level may be attenuated to an output level of, e.g., 0 V. A high voltage level of a data signal, for example a voltage level of 1.45 V, is amplified to a high output level of 2.5 V, for example. The bit lines connected to the memory cells in which the data signals are intended to be stored are driven with the low or high voltage level, respectively, by the input amplifier. Particularly in the case of an integrated semiconductor memory, a differential amplifier circuit is generally used as input amplifier.

FIG. 7 depicts a known circuit of a differential amplifier in CMOS technology such as is generally used as an input amplifier for an integrated semiconductor memory. Connected between a terminal VA for application of a supply potential VDD and a terminal VB for application of a reference potential VSS are a current mirror circuit 1 as active load, which includes two transistors T1 and T2, a transistor T3 for application of an input signal Vin', a transistor T4 for application of a reference signal Vref' and a current mirror circuit 2 for generating the source summation current ISS. The current mirror circuit 2 is connected via a resistor R to the terminal VA for application of the supply potential VDD and includes two transistors T5 and T6. For the purpose of generating an output signal Vout', the input terminal E1', which represents the control terminal of the transistor T3, is driven with the input signal Vin'. A second input terminal E2', which forms the control terminal of the transistor T4, is driven with the reference signal Vref'. With correct dimensioning of the transistors T1, ..., T6, the differential amplifier circuit generates the output signal Vout' with a high level if the level of the input signal Vin' lies above the level of the reference signal Vref'. Conversely, the differential amplifier circuit generates the output signal Vout' with a low level if the input signal Vin' lies below the level of the reference signal Vref'.

Data transfer rates, particularly in CMOS technology, have continually increased in recent years. In order to meet the high speed requirements, the source summation current ISS, which is fed into the two parallel branches of the differential amplifier by the current mirror circuit 2 acting as a current source, has to be increased further and further. The present high speed requirements thus cause an extreme rise in the current consumption of the differential amplifier in CMOS technology used as an input amplifier. A low current consumption is generally of interest, however.

A further difficulty in the use of a conventional differential amplifier as an input amplifier of an integrated semiconductor memory arises from the fact that the supply voltages that are available on the motherboard of a computer are decreasing further and further. Consequently, it is becoming more and more difficult to operate the transistors T1, ..., T6 connected between the supply potential and the reference potential. In addition to the drain-source voltage drops at these transistors, the threshold voltages of the transistors also pose a problem, in particular, since they cannot be scaled with the decreasing supply voltages. The consequence is that three transistors in series, such as, for example, the transistors T1 and T2 of the active load 1, the input transistors T3 and T4, respectively, and the transistors of the current mirror circuit 2, can no longer be driven, or can be driven only with very great difficulty, between the high supply potential VDD and the reference potential VSS.

As described above, the differential amplifier compares a high or low level of the input signal Vin' with the level of the reference signal Vref'. The operating point of the differential amplifier circuit is set in such a way that, at a level of the reference signal Vref' that lies precisely in the middle between a possible high or low level of the input signal Vin', the differential amplifier circuit generates, on the output side, the output signal Vout' with an amplified high or low output level matched to the downstream circuit stages. The small supply voltages or the tolerances of resistors of a voltage divider from which the potential of the reference voltage is generally generated have the effect, however, that the level of the reference signal Vref' cannot be set precisely to the middle level between the high voltage potential and the low voltage potential of the input signal Vin'. On account of this inaccuracy with which the reference level can be set, the differential amplifier circuit very easily drifts from its operating point.

A further problem occurs by virtue of the fact that in general not every input signal Vin' is coupled to a dedicated reference signal Vref' in the case of a differential amplifier as an input amplifier of an integrated semiconductor memory in CMOS technology. This has the effect that a noise signal superposed on the input signal is not simultaneously superposed on the reference signal as well. Consequently, the advantage of a high common-mode rejection, such as in the case of ECL logic for instance, is not afforded in the case of a differential amplifier in CMOS technology.

It has furthermore been shown that fluctuations of the reference voltage Vref' entail large deviations in the duty cycle. The duty cycle specifies how an input signal is temporally mapped into an output signal at the output terminal of the differential amplifier. The imprecise setting of the reference voltage ultimately has the effect that the temporal length of an input signal pulse does not correlate with the length of an output signal pulse. Signal distortions at the output terminal of the differential amplifier are the consequence.

The disadvantages described above have the effect that a conventional differential amplifier circuit becomes less and less usable as an input amplifier of an integrated semiconductor memory.

SUMMARY

An object of the present invention is to provide an integrated circuit for amplifying input signals that operates reliably to the greatest possible extent independently of fluctuations of a supply voltage and a reference voltage.

Another object of the present invention is to provide a method in which input signals are amplified reliably to the greatest possible extent independently of fluctuations of a supply voltage of the integrated circuit and a reference voltage derived therefrom.

The aforesaid objects are achieved individually and/or in combination, and it is not intended that the present invention be construed as requiring two or more of the objects to be combined unless expressly required by the claims attached hereto.

In accordance with the present invention, an integrated circuit comprises a first input terminal to apply of an input signal with a high and a low level, the input signal including a DC component, and a second input terminal to apply a reference signal with a constant level. The integrated circuit further comprises a first amplifier circuit to generate a first control signal with a first input terminal, the first input terminal of the first amplifier circuit being connected to the first input terminal that applies the input signal, and a second input terminal, the second input terminal of the first amplifier circuit being connected to the second input terminal that applies the reference signal, and a second amplifier circuit for generating a second control signal with a first input terminal, the first input terminal of the second amplifier circuit being connected to the first input terminal that applies the input signal, and with a second input terminal, the second input terminal of the second amplifier circuit being connected to the second input terminal that applies the reference signal, and a third amplifier circuit with a first controllable resistor that is controlled by the first control signal, and with a second controllable resistor that is controlled by the second control signal.

The first and second amplifier circuits are designed in such a way that the first amplifier circuit, on account of the driving with the high level of the input signal, generates the first control signal with one level, so that the first controllable resistor of the third amplifier circuit is controlled in low-resistance fashion, and the second amplifier circuit, on account of the driving with the high level of the input signal, generates the second control signal with one level, so that the second controllable resistor of the third amplifier circuit is controlled in high-resistance fashion, if the constant level of the reference signal lies between the high and low levels of the input signal. The first and second amplifier circuits are designed in such a way that the first amplifier circuit, on account of the driving with the low level of the input signal, generates the first control signal with another level, so that the first controllable resistor of the third amplifier circuit is controlled in high-resistance fashion, and the second amplifier circuit, on account of the driving with the low level of the input signal, generates the second control signal with another level, so that the second controllable resistor of the third amplifier circuit is controlled in low-resistance fashion, if the constant level of the reference signal lies between the high and low levels of the input signal. Furthermore, the first amplifier circuit comprises a controllable resistor with a control terminal for setting a resistance value.

The control terminal of the controllable resistor of the first amplifier circuit is connected to the second input terminal that applies the reference signal. The controllable resistor of the first amplifier circuit is designed in such a way that it has a first resistance value if the reference signal has the level of the DC component of the input signal. Preferably, the controllable resistor of the first amplifier circuit is designed in such a way that it has a second resistance value if the reference signal exceeds the level of the DC component of the input signal, the second resistance value lying below the first resistance value.

The use of the first and second amplifier circuits thus ensures that the integrated circuit can still reliably evaluate the high and low levels of the input signal even when the level of the reference signal fluctuates in such a way that it attains the high or low level of the input signal. This is not the case with a conventional differential amplifier circuit that is usually used as an input amplifier in an integrated semiconductor memory. The conventional differential amplifier generally operates reliably only when the high or low level of the input signal differs from the level of the reference signal.

The use of the controllable resistor of the first amplifier circuit, the resistance value of which is controlled by the reference signal, makes it possible to adapt the first control signal to control the first controllable resistor of the third amplifier circuit to fluctuations of the reference signal. If the controllable resistor of the first amplifier circuit is designed as an n-channel field effect transistor, by way of example, a rising of the level of the reference signal by which the controllable resistor of the first amplifier circuit is controlled, causes the controllable path of the n-channel field effect transistor to be controlled in very low-resistance fashion. As a result, the level of the first control signal is lowered further if the first transistor of the first amplifier circuit is controlled in the on state. If it is assumed that the first controllable resistor of the third amplifier circuit that is driven by the first control signal is designed as a p-channel field effect transistor, this is thereby once again controlled in very low-resistance fashion. As a result the high level of the supply voltage can be forwarded to the output terminal of the amplifier circuit without an appreciable voltage drop at the first controllable resistor of the third amplifier circuit.

According to an embodiment of the integrated circuit according to the invention, the first and second amplifier circuits are designed in such a way that the first amplifier circuit, on account of the driving with the high level of the input signal, generates the first control signal with a first level, so that the first controllable resistor of the third amplifier circuit is controlled in low-resistance fashion, and the second amplifier circuit, on account of the driving with the high level of the input signal, generates the second control signal with a first level, so that the second controllable resistor of the third amplifier circuit is controlled in high-resistance fashion, if the level of the reference signal corresponds with the level of the DC component of the input signal. Furthermore, the first and second amplifier circuits are designed in such a way that the first amplifier circuit, on account of the driving with the low level of the input signal, generates the first control signal with a second level, so that the first controllable resistor of the third amplifier circuit is controlled in high-resistance fashion, and the second amplifier circuit, on account of the driving with the low level of the input signal, generates the second control signal with a second level, so that the second controllable resistor of the third amplifier circuit is controlled in low-resistance fashion, if the level of the reference signal corresponds with the level of the DC component of the input signal.

In a further embodiment of the integrated circuit, the first amplifier circuit is designed in such a way that, on account of the driving with the high level of the input signal, it generates the first control signal with a level below the first level of the first control signal if the level of the reference signal lies above the level of the DC component of the input signal.

Furthermore, the second amplifier circuit may be designed in such a way that, on account of the driving with the low level of the input signal, it generates the second control signal with a level above the second level of the second control signal if the level of the reference signal lies below the level of the DC component of the input signal.

The integrated circuit according to the invention is thus able to adapt to fluctuations of the level of the reference signal. A rise in the level of the reference signal effects a lowering of the level of the first control signal, whereas a lowering of the level of the reference signal effects a rise in the level of the second control signal.

In a further embodiment, the integrated circuit according to the invention includes a terminal to apply a supply potential and a terminal to apply a reference potential. The first and second amplifier circuit are in each case connected between the terminal that applies the supply potential and the terminal that applies the reference potential.

According to a further embodiment of the integrated circuit of the invention, the third amplifier circuit includes an output terminal. The first controllable resistor of the third amplifier circuit is connected between the terminal that applies the supply potential and the output terminal of the third amplifier circuit. It includes a control terminal, to which the first control signal is fed. The second controllable resistor of the third amplifier circuit is connected between the terminal that applies the reference potential and the output terminal of the third amplifier circuit. It has a control terminal, to which the second control signal is fed.

The input signal is split into two control signals in the first and second amplifier circuits. The first control signal controls the first controllable resistor in high- or low-resistance fashion, whereas the second control signal controls the second controllable resistor in high- or low-resistance fashion. In the case of a differential amplifier circuit, by contrast, a single output signal is usually generated on an input signal. This output signal then drives two complementary transistors of an output driver circuit connected downstream. Generating two control signals by the first and second amplifier circuits thus affords the advantage that the two control signals can be adapted to the control behavior of the respective first or second controllable resistor of the third amplifier circuit.

In another embodiment of the integrated circuit of the invention, the first amplifier circuit comprises a first transistor with a gate terminal, a source terminal and a drain terminal that generates the first control signal. The gate terminal of the first transistor of the first amplifier circuit is connected to the first input terminal that applies the input signal. The drain terminal of the first transistor of the first amplifier circuit is connected to the control terminal of the first controllable resistor of the third amplifier circuit.

In still another embodiment of the integrated circuit of the invention, the first amplifier circuit comprises a first resistor and a second resistor that sets an operating point of the first amplifier circuit. The first resistor of the first amplifier circuit is connected between the terminal that applies the supply potential and the drain terminal of the first transistor of the first amplifier circuit. The second resistor of the first amplifier circuit is connected to the terminal that applies the reference potential. The controllable resistor of the first amplifier circuit is connected between the source terminal of the first transistor of the first amplifier circuit and the second resistor of the first amplifier circuit.

Through corresponding dimensioning of the first and second resistors of the first amplifier circuit, it is thus possible to generate the first control signal with the first or second level from the input signal, the first and second levels of the first control signal being adapted to the control behavior of the first controllable resistor of the third amplifier circuit. Consequently, the first control signal can be generated for example with the first level, which controls the first controllable resistor of the third amplifier circuit in low-resistance fashion, or be generated with the second level, which controls the first controllable resistor of the third amplifier circuit in high-resistance fashion, if the first controllable resistor of the third amplifier circuit is designed as a p-channel effect transistor, for example.

In an embodiment of the integrated circuit according to the invention, the first transistor of the first amplifier circuit and the controllable resistor of the first amplifier circuit may in each case be designed as an n-channel field effect transistor.

In a further embodiment of the integrated circuit of the invention, the second amplifier circuit includes a first transistor with a gate terminal, with a source terminal and with a drain terminal that generates the second control signal. The gate terminal of the first transistor of the second amplifier circuit is connected to the first input terminal that apples the input signal. Furthermore, the drain terminal of the first transistor of the second amplifier circuit is connected to the control terminal of the second controllable resistor of the third amplifier circuit.

According to yet another embodiment of the integrated circuit according to the invention, the second amplifier circuit comprises a controllable resistor with a control terminal that sets a resistance value. The control terminal of the controllable resistor of the first amplifier circuit is connected to the second input terminal that applies the reference signal. The controllable resistor of the second amplifier circuit is designed in such a way that it has a first resistance value if the reference signal has the level of the DC component of the input signal. The controllable resistor of the second amplifier circuit is designed in such a way that it has a second resistance value if the reference signal falls below the level of the DC component of the input signal, the second resistance value lying below the first resistance value.

The use of the controllable resistor of the second amplifier circuit, the resistance value of which is controlled by the reference signal, makes it possible to adapt the second control signal to control the second controllable resistor of the third amplifier circuit to fluctuations of the reference signal. A lowering of the level of the reference signal causes a lowering of the resistance of the controllable resistor of the second amplifier circuit if the controllable resistor of the second amplifier circuit is designed as a p-channel field effect transistor, for example. If the first transistor of the second amplifier circuit is controlled in the on state, the level of the second control signal thus rises. If the second controllable resistor of the third amplifier circuit that is controlled by the second control signal is designed as an n-channel field effect transistor, for example, the risen level of the second control signal causes the controllable path of the n-channel field effect transistor to be controlled in very low-resistance fashion. The level of the reference potential can thus be transferred to the output terminal of the third amplifier circuit in very low-resistance fashion.

In a further embodiment of the integrated circuit according to the invention, the second amplifier circuit comprises a first resistor and a second resistor to set an operating point of the second amplifier circuit. The first resistor of the second amplifier circuit is connected between the terminal that applies the reference potential and the drain terminal of the first transistor of the first amplifier circuit. The second resistor of the second amplifier circuit is connected to the terminal that applies the supply potential. The controllable resistor of the second amplifier circuit is connected between the source terminal of the first transistor of the second amplifier circuit and the second resistor of the second amplifier circuit.

By corresponding dimensioning of the first and second resistors of the second amplifier circuit, it is possible to adapt the level of the second control signal (generated by the second amplifier circuit, for controlling the second controllable resistor of the third amplifier circuit to the control behavior of the second controllable resistor of the third amplifier circuit. Consequently, the second control signal can be generated for example with the first level, which controls the second controllable resistor of the third amplifier circuit in high-resistance fashion, or be generated with the second level, which controls the second controllable resistor of the third amplifier circuit in low-resistance fashion, if the resistor is designed as an n-channel field effect transistor.

In one embodiment, the first transistor of the second amplifier circuit and the controllable resistor of the second amplifier circuit are in each case designed as a p-channel field effect transistor. In this embodiment, each of the first and second amplifier circuits represents an amplifier in a common-source connection. The input signal can thereby be amplified with a large voltage gain. Accordingly, the distance between the first and second levels of the first and second control signals is significantly greater than the distance between the high and low levels of the input signal.

In contrast to a differential amplifier circuit, which is essentially constructed from a current mirror as active load and a current mirror for generating the source summation current and also a transistor for application of an input signal and a further transistor for application of a reference signal, which are connected between a supply potential and a reference potential, the first, second and third amplifier circuits and also the inverter circuit of the present integrated circuit have only one or two transistors between the terminal that applies the supply potential and the terminal that applies the reference potential. This compact structure of the integrated circuit according to the invention leads to an improvement of the transit times of input signals compared with an input amplifier designed as a differential amplifier circuit.

A further advantage of the integrated circuit according to the invention lies in the simplicity of the circuit, which essentially includes nonreactive resistors and transistors that are used as amplifier transistors, switching transistors and as controlled resistors.

According to a further embodiment of the integrated circuit of the invention, the circuit includes an output terminal and an inverter circuit. The inverter circuit is connected between the terminal that applies the supply potential and the terminal that applies the reference potential. The output terminal of the third amplifier circuit is connected to the output terminal of the integrated circuit via the inverter circuit.

In comparison with the differential amplifiers concept, the proposed circuit of an input amplifier is distinguished particularly in its reliable mode of operation, which remains ensured even at low supply voltages. In the conventional differential amplifier concept, the supply voltage has to be large enough to furnish the control voltages for controlling the transistors of the two current mirror circuits for generating the active load and for generating the source summation current and the drain-source voltages of the respective transistors that are connected between the supply potential and the reference potential. In particular, the threshold voltages of the transistors cannot be concomitantly scaled with the ever decreasing supply voltages available in an integrated circuit. The consequence of this is that scarcely three transistors can be operated in series, such as is the case for example in the differential amplifier concept by virtue of the two current mirror circuits and the transistors for application of the input and reference signals. In contrast, in the first and second amplifier circuits of the integrated circuit of the invention, apart from the controllable resistor, only one amplifier transistor in each case and, in the third amplifier circuit and also in the inverter circuit, only two transistors are operated in series between the terminals that apply the supply potential and the reference potential.

In another embodiment of the integrated circuit of the invention, the first controllable resistor of the third amplifier circuit is designed as a p-channel field effect transistor. The second controllable resistor of the third amplifier circuit is designed as an n-channel field effect transistor. In this embodiment of the first and second controllable resistors of the third amplifier circuit, the first level of the first and second control signals is designed as a low voltage level and the second level of the first and second control signal is designed as a high voltage level.

A method according to the present invention provides for the use of an input signal with a high and a low level, the input signal having a DC component. Furthermore, provision is made of a reference signal with a constant level corresponding to a level of the DC component of the input signal. The method is applied to an integrated circuit with a first amplifier circuit, which has a transistor and a controllable resistor, a second amplifier circuit, which likewise has a transistor and a controllable resistor, and a third amplifier circuit, in which a supply potential can be fed via a first controllable resistor of the third amplifier circuit and a reference potential can be fed via a second controllable resistor of the third amplifier circuit to an output terminal of the third amplifier circuit.

The method includes applying, during first and second method steps, the constant level of the reference signal to a second input terminal of the first amplifier circuit for the purpose of controlling the controllable resistor of the first amplifier circuit and to a second input terminal of the second amplifier circuit for the purpose of controlling the controllable resistor of the second amplifier circuit.

The first method step includes applying the high level of the input signal to a first input terminal of the first amplifier circuit for the purpose of controlling the transistor of the first amplifier circuit and to a first input terminal of the second amplifier circuit for the purpose of controlling the transistor of the second amplifier circuit. Consequently, the first amplifier circuit generates a first control signal with a first level, whereupon the first controllable resistor of the third amplifier circuit is controlled into a low-resistance state or level on account of a driving of the first controllable resistor of the third amplifier circuit with the first level of the first control signal. The second amplifier circuit generates a second control signal with a first level, whereupon the second controllable resistor of the third amplifier circuit is controlled into a high-resistance state or level on account of a driving of the second controllable resistor of the third amplifier circuit with the first level of the second control signal.

The second method step includes applying the low level of the input signal to the first input terminal of the first amplifier circuit for the purpose of controlling the transistor of the first amplifier circuit and to the first input terminal of the second amplifier circuit for the purpose of controlling the transistor of the second amplifier circuit. The first amplifier circuit thereupon generates the first control signal with a second level, whereupon the first controllable resistor of the third amplifier circuit is controlled into a high-resistance state or level on account of a driving of the first controllable resistor of the third amplifier circuit with the second level of the first control signal. The second amplifier circuit generates the second control signal with a second level, whereupon the second controllable resistor of the third amplifier circuit is controlled into a low-resistance state or level on account of a driving of the second controllable resistor of the third amplifier circuit with the second level of the second control signal.

A method in accordance with the invention for amplifying an input signal uses an input signal with a high and a low level, the input signal having a DC component. The use of a reference signal with a constant level lying above a level of the DC component of the input signal is furthermore provided. The method according to the invention is applied to an integrated circuit with a first amplifier circuit, which has a transistor and a controllable resistor, a second amplifier circuit, which likewise has a transistor and a controllable resistor, and a third amplifier circuit, in which a supply potential is fed via a first controllable resistor of the third amplifier circuit and a reference potential is fed via a second controllable resistor of the third amplifier circuit to an output terminal of the third amplifier circuit.

During a first and a second method step, the constant level of the reference signal is applied to a second input terminal of the first amplifier circuit for the purpose of controlling the controllable resistor of the first amplifier circuit and to a second input terminal of the second amplifier circuit for the purpose of controlling the controllable resistor of the second amplifier circuit.

The first method step includes applying the high level of the input signal to a first input terminal of the first amplifier circuit for the purpose of controlling the transistor of the first amplifier circuit and to a first input terminal of the second amplifier circuit for the purpose of controlling the transistor of the second amplifier circuit. The first amplifier circuit thereupon generates a first control signal with a first level, the level of the first control signal lying below the level generated by the first amplifier circuit if the constant level of the reference voltage corresponds with the level of the DC component of the input signal. As a consequence, the first controllable resistor of the third amplifier circuit is controlled into a low-resistance state on account of a driving of the first controllable resistor of the third amplifier circuit with the first level of the first control signal. The second amplifier circuit generates a second control signal with a first level, whereupon the second controllable resistor of the third amplifier circuit is controlled into a high-resistance state on account of a driving of the second controllable resistor of the third amplifier circuit with the first level of the second control signal.

The second method step includes applying the low level of the input signal to the first input terminal of the first amplifier circuit for the purpose of controlling the transistor of the first amplifier circuit and to the first input terminal of the second amplifier circuit for the purpose of controlling the transistor of the second amplifier circuit. The first amplifier circuit thereupon generates the first control signal with a second level, whereupon the first controllable resistor of the third amplifier circuit is controlled into a high-resistance state on account of a driving of the first controllable resistor of the third amplifier circuit with the second level of the first control signal. The second control signal is generated with a second level by the second amplifier circuit, the level of the second control signal lying below the level generated by the second amplifier circuit if the constant level of the reference signal corresponds with the level of the DC component of the input signal. As a consequence thereof, the second controllable resistor of the third amplifier circuit is controlled into a low-resistance state on account of a driving of the second controllable resistor of the third amplifier circuit with the second level of the second control signal.

A further method for amplifying an input signal in accordace with the invention uses an input signal with a high and a low level, the input signal having a DC component. The use of a reference signal with a constant level lying below a level of the DC component of the input signal is furthermore provided. The method is applied to an integrated circuit with a first amplifier circuit, which has a transistor and a controllable resistor, a second amplifier circuit, which likewise has a transistor and a controllable resistor, and a third amplifier circuit, in which a supply potential can be fed via a first controllable resistor of the third amplifier circuit and a reference potential can be fed via a second controllable resistor of the third amplifier circuit to an output terminal of the third amplifier circuit.

During a first and a second method step, the constant level of the reference signal is applied to a second input terminal of the first amplifier circuit for the purpose of controlling the controllable resistor of the first amplifier circuit and to a second input terminal of the second amplifier circuit for the purpose of controlling the controllable resistor of the second amplifier circuit.

The first method step includes applying the high level of the input signal to a first input terminal of the first amplifier circuit for the purpose of controlling the transistor of the first amplifier circuit and to a first input terminal of the second amplifier circuit for the purpose of controlling the transistor of the second amplifier circuit. The first amplifier circuit thereupon generates a first control signal with a first level, the level of the first control signal lying above the level generated by the first amplifier circuit if the constant level of the reference voltage corresponds with the level of the DC component of the input signal. As a consequence thereof, the first controllable resistor of the third amplifier circuit is controlled into a low-resistance state on account of a driving of the first controllable resistor of the third amplifier circuit with the first level of the first control signal. The second amplifier circuit generates a second control signal with a first level, whereupon the second controllable resistor of the third amplifier circuit is controlled into a high-resistance state on account of a driving of the second controllable resistor of the third amplifier circuit with the first level of the second control signal.

The second method step includes applying the low level of the input signal to the first input terminal of the first amplifier circuit for the purpose of controlling the transistor of the first amplifier circuit and to the first input terminal of the second amplifier circuit for the purpose of controlling the transistor of the second amplifier circuit. The first amplifier circuit thereupon generates the first control signal with a second level, whereupon the first controllable resistor of the third amplifier circuit is controlled into a high-resistance state on account of a driving of the first controllable resistor of the third amplifier circuit with the second level of the first control signal. The second amplifier circuit generates the second control signal with a second level, the level of the second control signal lying above the level generated by the second amplifier circuit if the constant level of the reference voltage corresponds with the level of the DC component of the input signal. As a consequence, the second controllable resistor of the third amplifier circuit is controlled into a low-resistance state on account of a driving of the second controllable resistor of the third amplifier circuit with the second level of the second control signal.

The above and still further objects, features and advantages of the present invention will become apparent upon consideration of the following detailed description of specific embodiments thereof, particularly when taken in conjunction with the accompanying drawings.

BRIEF DESCRIPTION OF THE FIGURES

FIG. 2C depicts a third example of a signal state diagram of the integrated circuit according to the invention.

DETAILED DESCRIPTION

Figure 1:
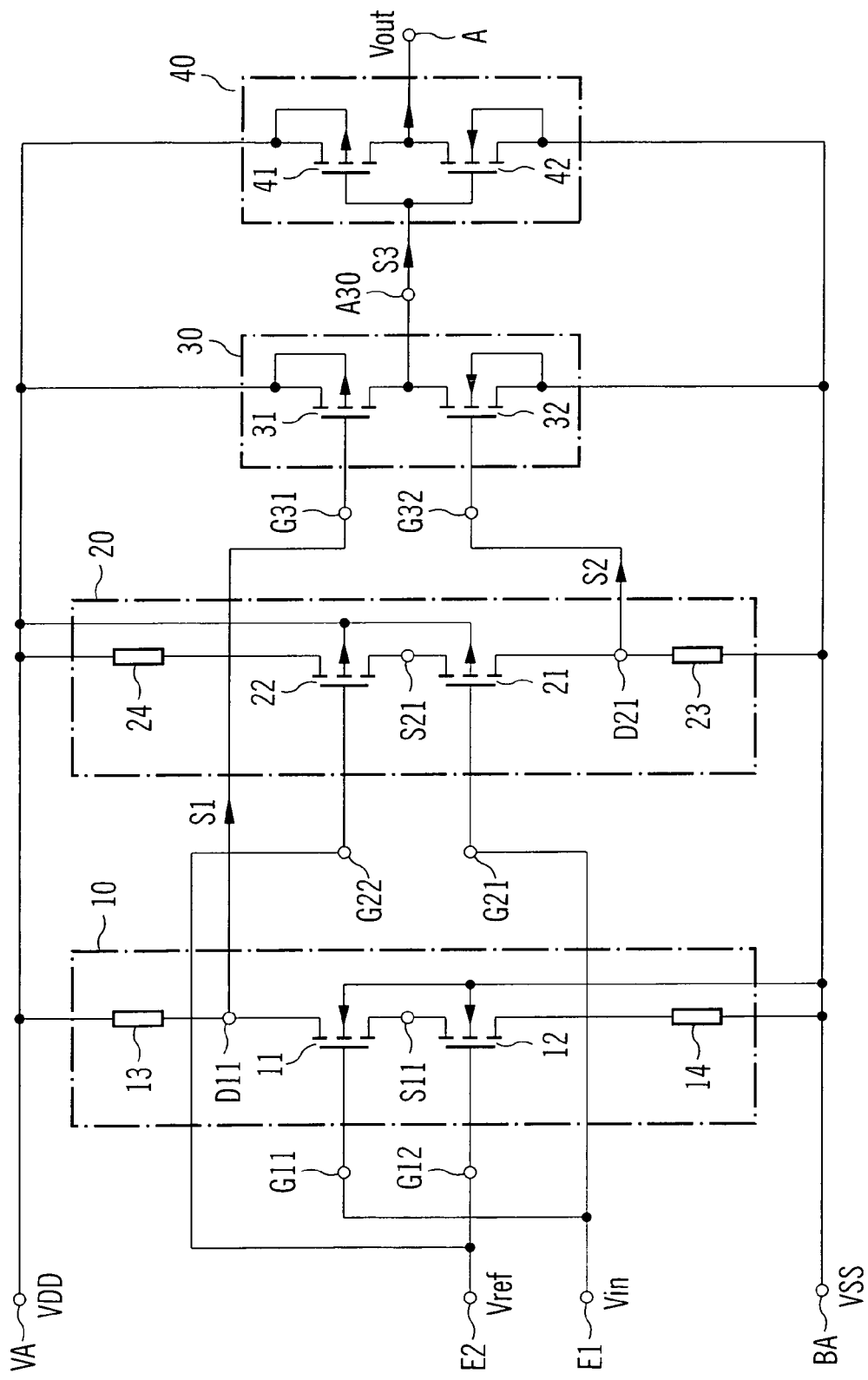
FIG. 1 depicts an integrated circuit for amplifying an input signal according to the invention.

FIG. 1 depicts an embodiment of an integrated circuit for amplifying an input signal according to the invention. The integrated circuit includes a terminal VA for application of a supply potential VDD and a terminal BA for application of a reference potential VSS. The circuit further includes a first input terminal E1 that applies an input signal Vin and a second input terminal E2 that applies a reference signal Vref. A first amplifier circuit 10, a second amplifier circuit 20, a third amplifier circuit 30 and an inverter circuit 40 are connected between the terminal VA for application of the supply potential VDD and the terminal BA for application of the reference potential VSS.

The first amplifier circuit 10 is designed as a source amplifier circuit acting as a preamplifier. The first amplifier circuit includes a transistor 11 connected by the common-source connection technique, the gate terminal G11 of the transistor being connected to the first input terminal E1 for application of the input signal Vin. A drain terminal D11 of the transistor 11 is connected via a first resistor 13 to the terminal VA for application of the supply potential VDD. The source terminal S11 of the transistor 11 is connected via a further transistor 12 and a second resistor 14 to a terminal BA for application of the reference potential VSS. The transistor 12 acts as a controlled resistor. The resistance value of its drain-source path can be set by the application of a control signal to its gate terminal G12. The gate terminal G12 of the transistor 12 is connected to the second input terminal E2 for application of the reference signal Vref. The level of the reference signal Vref thus regulates the resistance value of the transistor 12. Since the transistor 12 is designed as an n-channel MOSFET transistor, an increase in the level of the reference signal Vref effects a decrease in its drain-source resistance and, conversely, a decrease in the level of the reference signal effects an increase in the resistance of its drain-source path.

The second amplifier circuit 20 likewise represents a circuit using the common-source connection technique and acts as a preamplifier for the input signal Vin. For this purpose, it has a transistor 21, the gate terminal G21 of which is connected to the first input terminal E1 for application of the input signal Vin. A drain terminal D21 of the transistor 21 is connected via a first resistor 23 of the second amplifier circuit 20 to the terminal BA for application of the reference potential VSS. The transistor 21 is designed as a p-channel MOSFET transistor. Its source terminal S21 is connected via a controllable resistor 22 and a second resistor 24 of the second amplifier circuit 20 to the terminal VA for application of the supply potential VDD. The controllable resistor 22 is implemented as a transistor. The resistance value of its drain-source path can be set by the application of a control signal to its gate terminal G22. For this purpose, the gate terminal G22 is connected to the second input terminal for application of the reference signal Vref. Consequently, the resistance of the drain-source path of the transistor 22 can be set by way of the level of the reference signal Vref. Since the controllable resistor 22 is designed as a p-channel MOSFET transistor, an increase in the level of the reference signal Vref effects an increase in the resistance and a decrease in the level of the reference signal Vref effects a decrease in its drain-source resistance.

Figure 7:
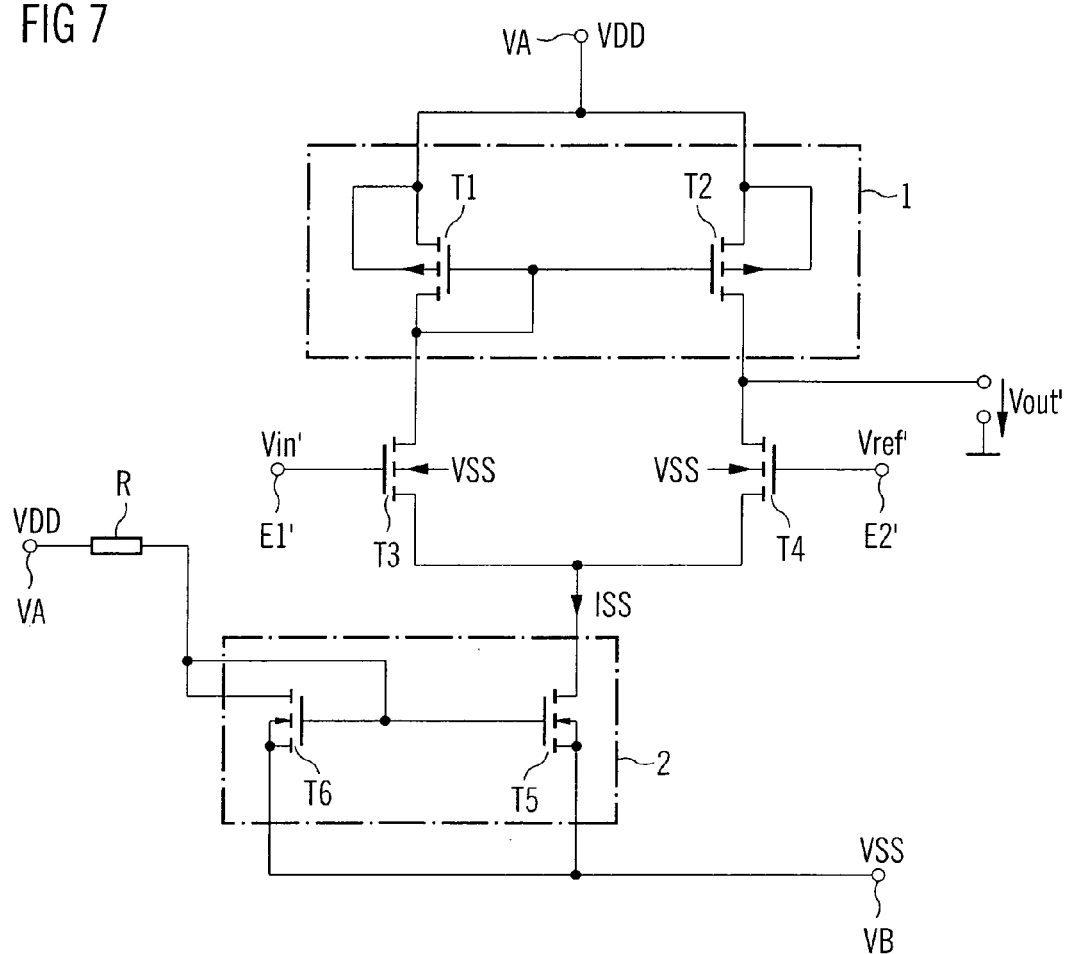
FIG. 7 depicts a prior art integrated circuit for amplifying input signals.

The first amplifier circuit 10 generates a first control signal S1 at the drain terminal D11 of the transistor 11. The second amplifier circuit 20 generates a second control signal S2 at the drain terminal D21 of the transistor 21. Since the two preamplifiers 10 and 20 are designed as common-source connections with a high voltage gain, they enable a high gain of the input signal Vin. In order to obtain the high voltage gain, it is not necessary to increase a shunt current between the terminal for application of the supply potential VDD and the terminal for application of the reference potential VSS. In contrast thereto, in the case of an input amplifier realized as a conventional differential amplifier circuit, it is necessary to increase the source summation current between the terminal for application of the supply potential and the terminal for application of the reference potential VSS, which is generated by the current mirror circuit 2 in FIG. 7.

The operating point of the first and second preamplifier circuits 10 and 20, respectively, can be set by the resistors 13 and 14 and also by the channel length and channel width ratios of the transistors 11 and 12 of the first amplifier circuit 10 and, respectively, by the resistors 23 and 24 and also by the channel length and channel width ratios of the transistors 21 and 22 of the second preamplifier circuit 20. By splitting the input signal Vin into two control signals S1 of the first preamplifier and S2 of the second preamplifier, each of the two control signals can be individually adapted to the requirements of the output driver.

The output driver is formed by the third amplifier circuit 30 in the circuit design of FIG. 1. The third amplifier circuit includes a first transistor 31 and a second transistor 32. These two transistors act as controllable resistors. By driving the gate terminal G31 of the first transistor 31 of the third amplifier circuit 30 with the first control signal S1, the drain-source path of the transistor 31 can be operated in low-resistance fashion or high-resistance fashion. For the low-resistance or high-resistance control of the drain-source path of the second transistor 32 of the third amplifier circuit 30, the gate terminal G32 of the second transistor is driven by the second control signal S2 of the second preamplifier circuit 20.

Since the first controllable resistor 31 of the third amplifier circuit 30 is designed as a p-channel MOSFET transistor, a high level of the first control signal S1 effects a high-resistance mode of operation of the first controllable resistor 31. A high level of the second control signal S2 results in a low-resistance drain-source path of the second transistor 32 of the third amplifier circuit since the transistor is designed as an n-channel MOSFET transistor. Conversely, a low level of the first control signal S1 effects a low drain-source resistance of the p-channel MOSFET transistor 31 and a low level of the second control signal S2 effects an increase in the drain-source resistance of the n-channel MOSFET transistor 32.

Since the controllable resistors 31 and 32 are designed as complementary n- and p-channel MOSFET transistors and both are driven either by the high level or the low level of the first and second control signals, one of the two controllable resistors is always controlled in high-resistance fashion and the other of the two controllable resistors in low-resistance fashion. As a result, either the level of the supply potential VDD or the level of the reference potential VSS minus the voltage drop at the controllable resistors 31 and 32 is transferred to an output terminal A30 of the third amplifier circuit.

To generate at an output terminal A of the integrated circuit an output signal Vout with a level that approximately corresponds with the supply potential VDD or the reference potential VSS, the inverter circuit 40 is connected downstream of the third amplifier circuit 30. The inverter circuit includes a first switching transistor 41, designed as a p-channel field effect transistor for example, and a second switching transistor 42, designed as an n-channel field effect transistor for example. The first switching transistor 41 is connected by its drain-source path between the terminal for application of the supply potential VDD and the output terminal A of the integrated circuit, whereas the second switching transistor 42 is connected between the terminal BA for application of the reference potential VSS and the output terminal A of the integrated circuit.

Each of the signal state diagrams depicted in FIGS. 2A, 2B, 2C, 2D, 3, 4, 5 and 6 shows the profile of the input signal Vin, of the reference signal Vref, of the first control signal S1, of the second control signal S2, of the third control signal S3 and of the output signal Vout. The functioning of the integrated circuit in accordance with FIG. 1 is explained in more detail below with reference to FIG. 2A.

Figure 2A:
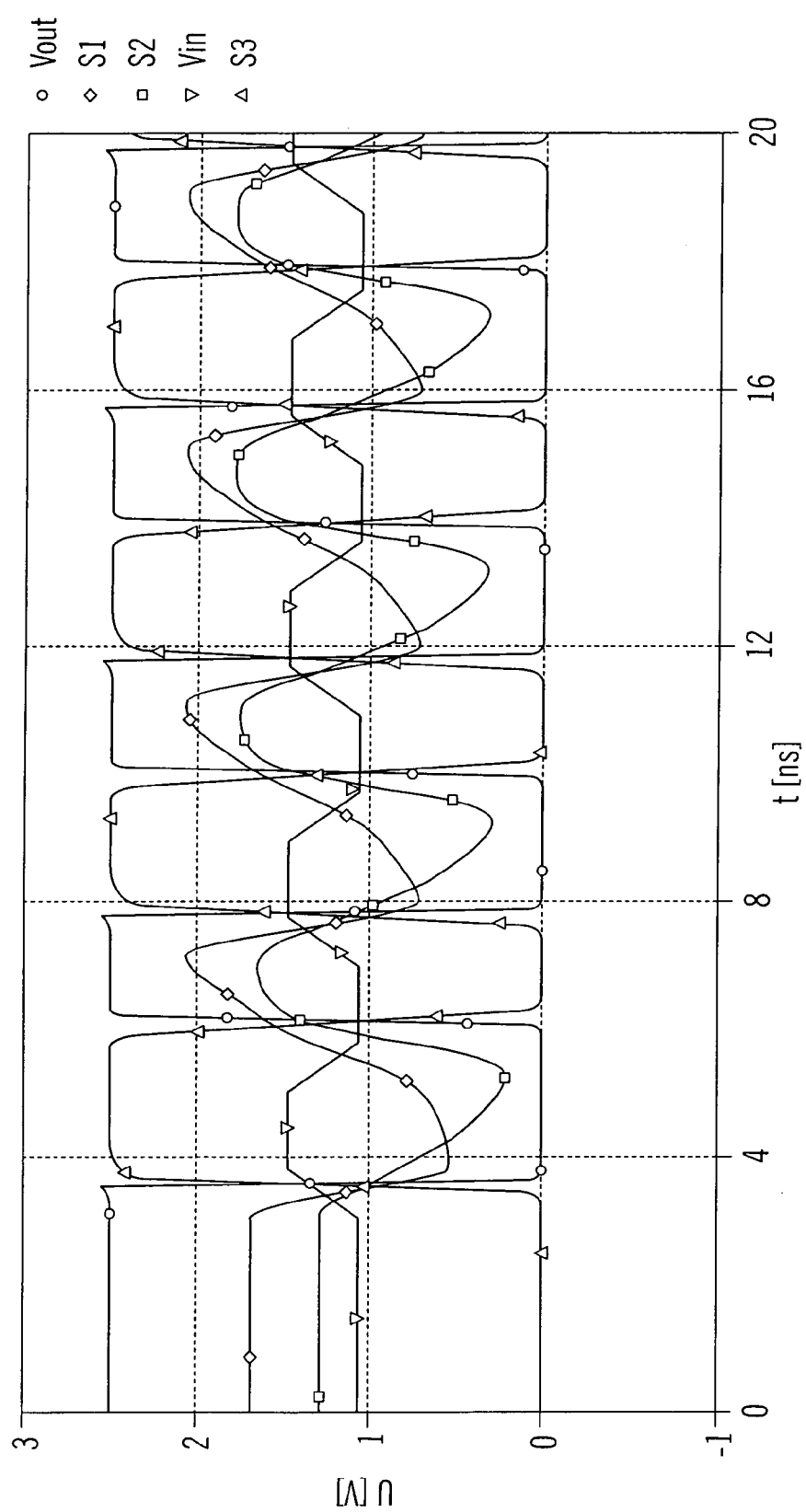
FIG. 2A depicts a first example of a signal state diagram of the integrated circuit according to the invention.

FIG. 2A depicts the profile of the signals noted above at a supply voltage of 2.5 V. The input signal Vin has a high level of 1.45 V and a low level of 1.05 V, which executes a periodic oscillation with a frequency of 250 MHz about a DC component of 1.25 V. The reference signal Vref has a level of 1.25 V and thus lies precisely between the high level and the low level of the input signal Vin, that is to say corresponds here to the DC component thereof. Since the profile of the control signals is repeated from clock period to clock period, only the profile of the control signals within the first clock period between 4 ns and 8 ns is discussed here.

The level of the reference signal Vref causes the controllable resistor 12 of the first amplifier circuit 10 and the controllable resistor 22 of the second amplifier circuit 20 to assume a constant resistance value. The high level of the input signal Vin within the first clock period causes the n-channel MOSFET transistor 11 to be controlled in the on state. The drain terminal D11 of the transistor 11 of the first amplifier circuit 10 is thereby pulled to a low level. The accompanying low level of the control signal S1 thus causes the controllable resistor 31 of the third amplifier circuit 30 to be controlled into the low-resistance state or level. Conversely, the high level of the input signal Vin causes the transistor 21 of the second amplifier circuit 20 to be controlled into the off state. The drain terminal D21 of the transistor 21 of the second amplifier circuit 20 is thus pulled to a low level. The control signal S2 thus drives the gate terminal G32 of the second transistor 32 of the third amplifier circuit 30 with a low level, as a result of which the controllable resistor 22 is controlled in high-resistance fashion. As a result, the output terminal A30 of the third amplifier circuit is connected in low-resistance fashion to the terminal VA for application of the supply potential VDD. The third control signal S3 thus assumes a high level.

A driving of the downstream inverter circuit 40 with the high level of the third control signal S3 results, at the output terminal A of the integrated circuit, in a low level of the output signal Vout approximately corresponding to the low level of the reference potential VSS.

In the second half of the first clock period, the input signal Vin assumes the low signal level of 1.05 V. The low level of the input signal causes the transistor 11 of the first amplifier circuit 10 to turn off. The drain terminal D11 of the transistor 11 of the first amplifier circuit 10 is thus pulled to a high level since it is connected to the supply potential VDD via the first resistor 13 of the first amplifier circuit. The accompanying high level of the first control signal S1 causes the drain-source path of the first transistor 31 of the third amplifier circuit 30 to be controlled into the high-resistance state or level. Conversely, the low level of the input signal Vin causes the p-channel MOSFET transistor 21 of the second amplifier circuit 20 to be controlled in the on state. The drain terminal D21 of the transistor 21 of the second amplifier circuit 20 is thus pulled to a high level via the connection of the controllable resistor 22 and of the second resistor 24 to the supply potential VDD. The associated high level of the second control signal S2 causes the second controllable resistor 32 of the third amplifier circuit to be controlled into the low-resistance state. The output terminal A30 of the third amplifier circuit 30 is connected to the terminal BA for application of the reference potential VSS via the transistor 32 controlled in low-resistance fashion. If the reference potential VSS is designed as a ground potential, then the output terminal A30 of the third amplifier circuit assumes a low signal level of the output signal Vout of 0 V, for example.

A driving of the downstream inverter circuit 40 with the low level of the third control signal S3 results, at the output terminal A of the integrated circuit, in a high level of the output signal Vout approximately corresponding to the high level of the supply potential VDD.

As a result of the use of the inverter circuit 40, the output signal Vout appears at the output terminal A of the integrated circuit with an inverted profile in comparison with the input signal Vin. By connecting a further inverter circuit (not actually illustrated in FIG. 1) downstream, it is possible to generate on the output side an output signal with a profile such that the high level of the input signal Vin corresponds with a high level of the output signal and the low level of the input signal Vin corresponds with a low level of the output signal.

The amplifying effect of the first amplifier circuit 10 and of the second amplifier circuit 20 can be discerned on the basis of the signal profiles of the first control signal S1 and of the second control signal S2. Through corresponding dimensioning of the nonreactive resistors 13 and 14 and of the channel length and channel width ratios of the transistor 11 and of the transistor 12 of the first amplifier circuit 10, the first control signal S1 can be individually adapted to the control behavior of the first transistor 31 of the third amplifier circuit 30. Equally, through corresponding dimensioning of the nonreactive resistors 23 and 24 and of the channel length and channel width ratios of the transistor 21 and of the transistor 22 of the second amplifier circuit 20, the second control signal S2 can be individually adapted to the control behavior of the second transistor 32 of the third amplifier circuit 30. In contrast to the conventional differential amplifier circuit of FIG. 7, which only provides one output signal Vout', here two control signals S1 and S2 are provided which are in each case adapted to the behavior of the downstream stage.

Figure 2B:
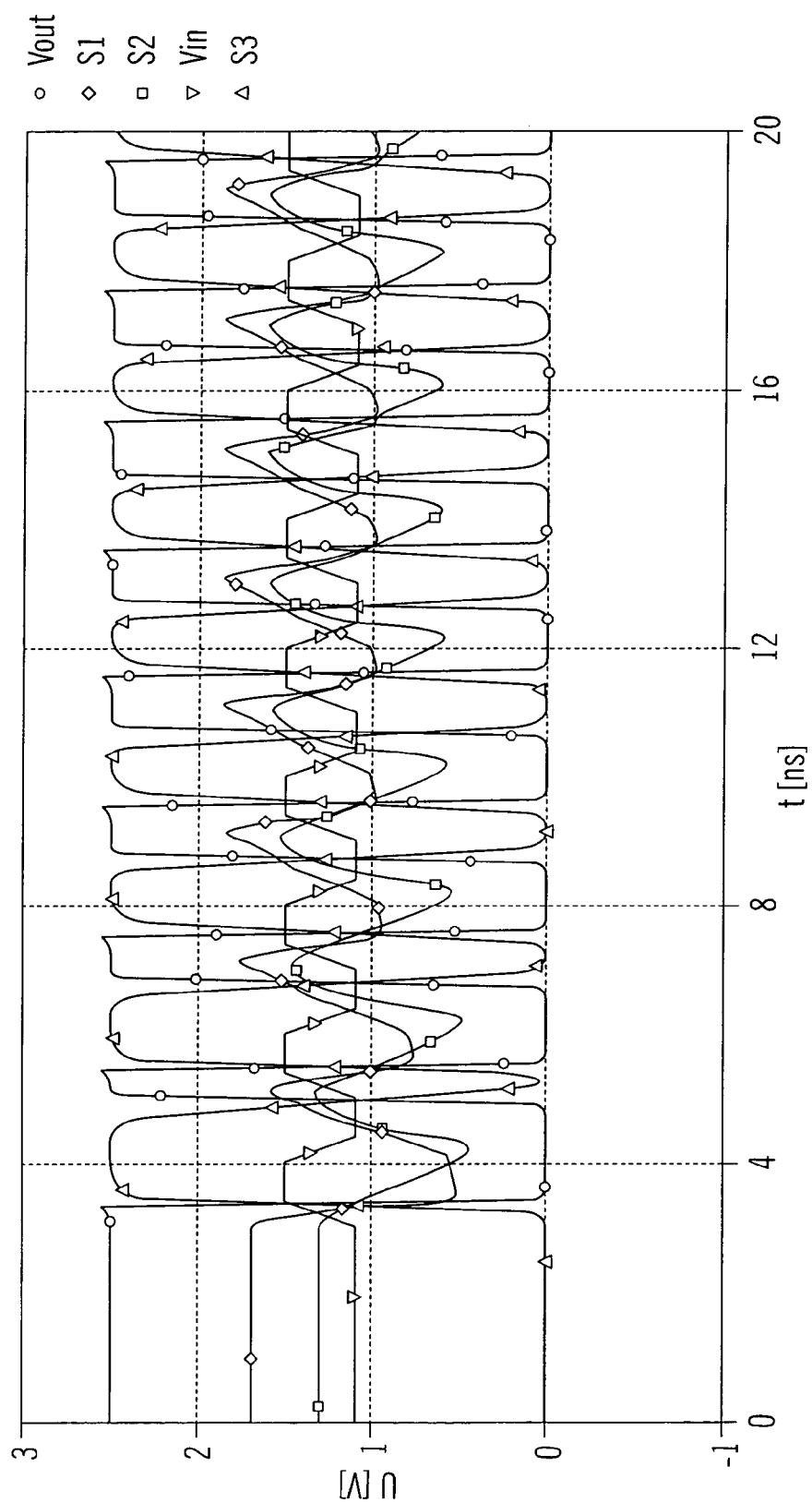
FIG. 2B depicts a second example of a signal state diagram of the integrated circuit according to the invention.
Figure 2D:
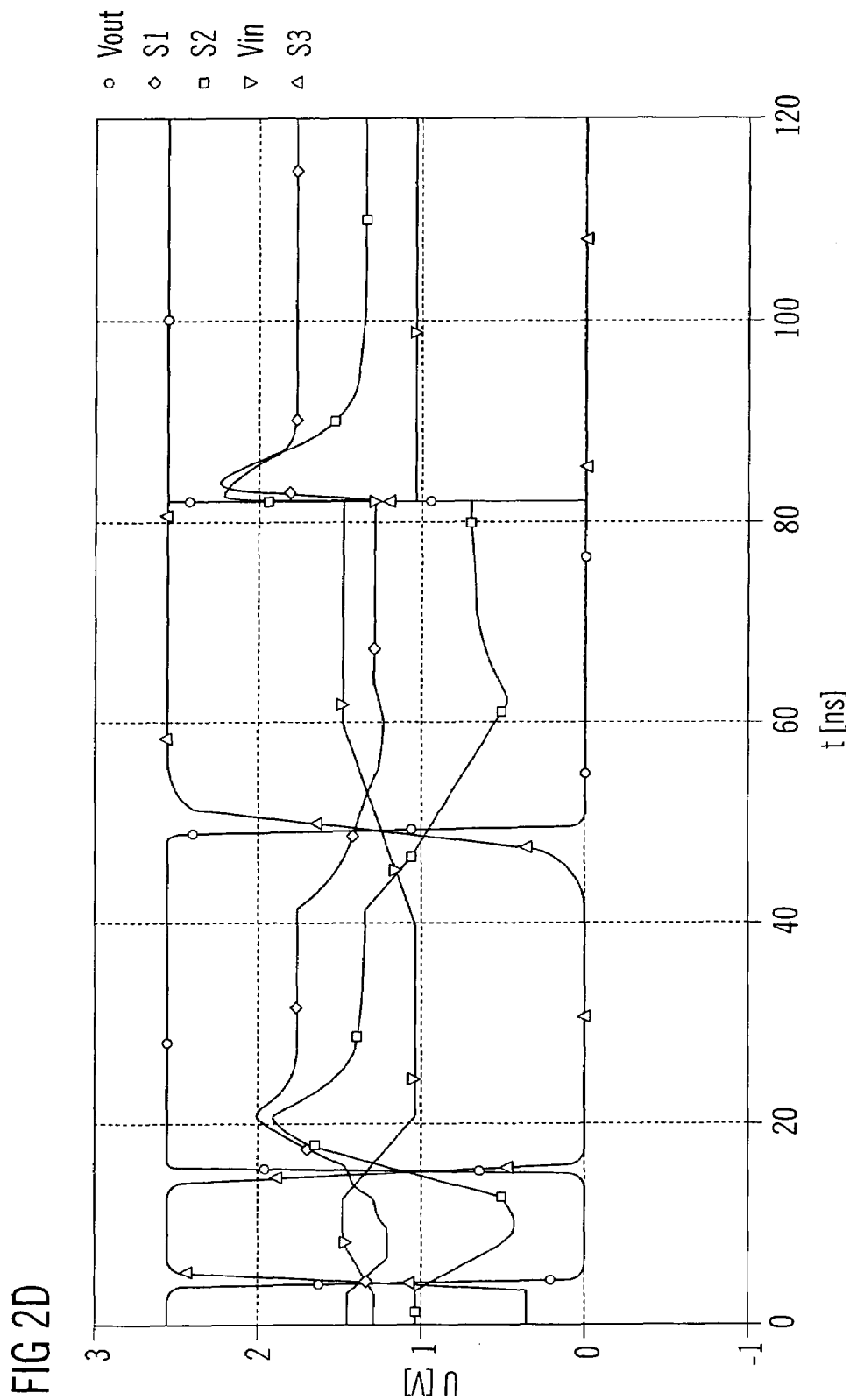
FIG. 2D depicts a fourth example of a signal state diagram of the integrated circuit according to the invention.

FIG. 2B depicts the behavior of the integrated circuit according to the invention for amplifying the input signal Vin at a frequency of 500 MHz. It is evident that even at this high frequency, the output signal Vout can follow the profile of the input signal Vin after a small signal distortion within the first clock period. Significant signal distortions no longer occur after the first clock period. FIG. 2C depicts the signal profiles in the case of an input signal Vin with steep signal edges. Even at the low frequency of 125 MHz illustrated, the output signal Vout can follow the input oscillation. FIG. 2D depicts the profile of the signals of the integrated circuit according to the invention at a low frequency and with distorted edges of the input signal Vin. Here, too, the output signal Vout follows the input signal Vin.

Figure 3:
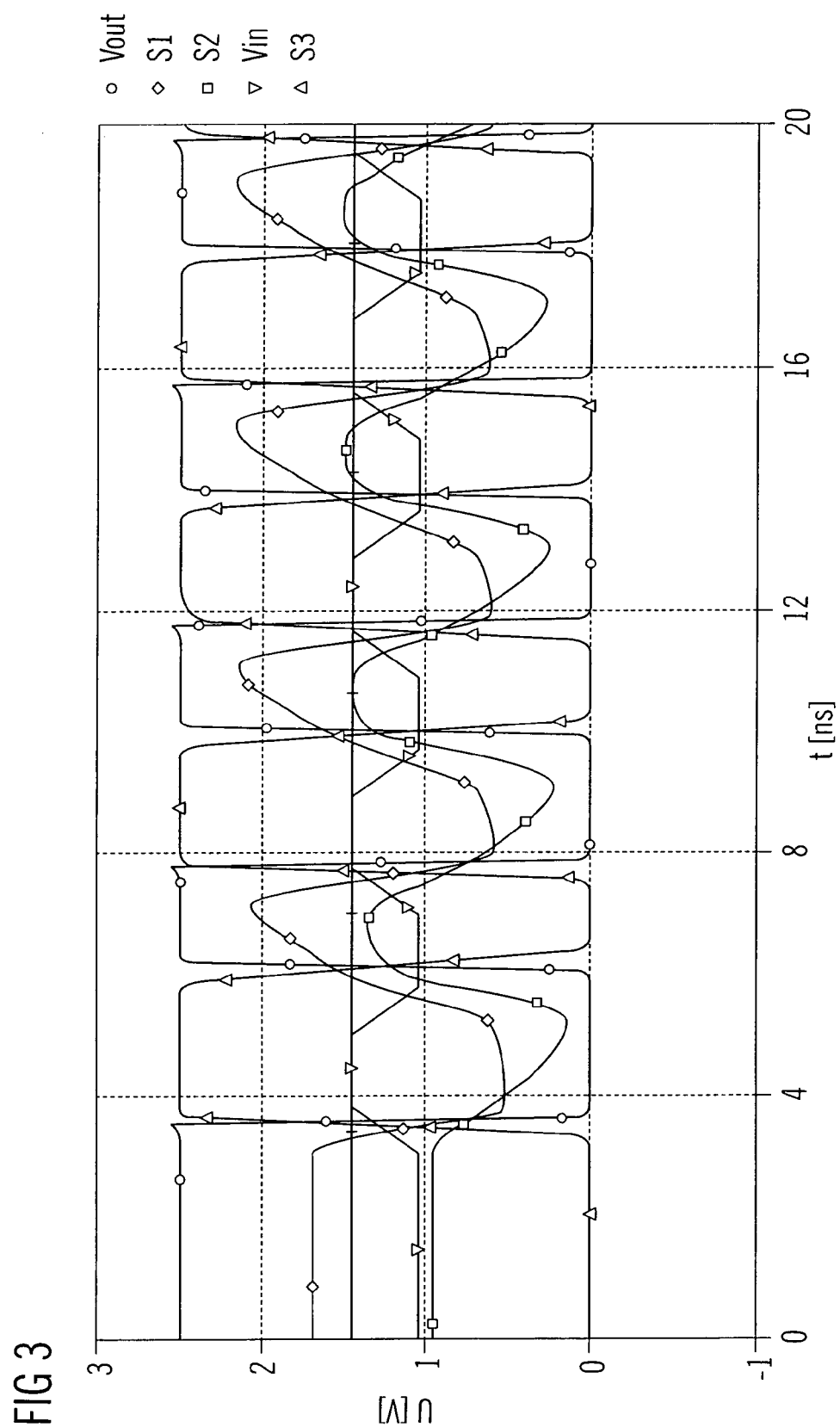
FIG. 3 depicts a fifth example of a signal state diagram of the integrated circuit according to the invention.

FIG. 3 depicts the signal profiles if the level of the reference signal Vref lies above the level of the DC component of the input signal Vin. The level of the reference signal Vref is 1.45 V here, whereas the level of the DC component of the input signal Vin is still 1.25 V. The drain-source resistance of the controllable resistor 12 of the first amplifier circuit 10 decreases as a result of the higher level of the reference signal Vref. At a high level of the input signal Vin, the level of the first control signal S1 thus also decreases in comparison to if the level of the reference signal Vref corresponds with the level of the DC component of the input signal. As a result of the lower level of the first control signal S1, the controllable path of the p-channel field effect transistor 31 of the third amplifier circuit 30 is controlled with lower resistance than is the case if the level of the reference signal Vref corresponds with the level of the DC component of the input signal. The supply voltage VDD is thus transferred to the output terminal A30 of the third amplifier circuit without an appreciable voltage drop at the drain-source path of the first controllable resistor 31. A conventional differential amplifier with its reference voltage at the high level of the input signal would hardly be able to follow the profile of the input signal.

Figure 4:
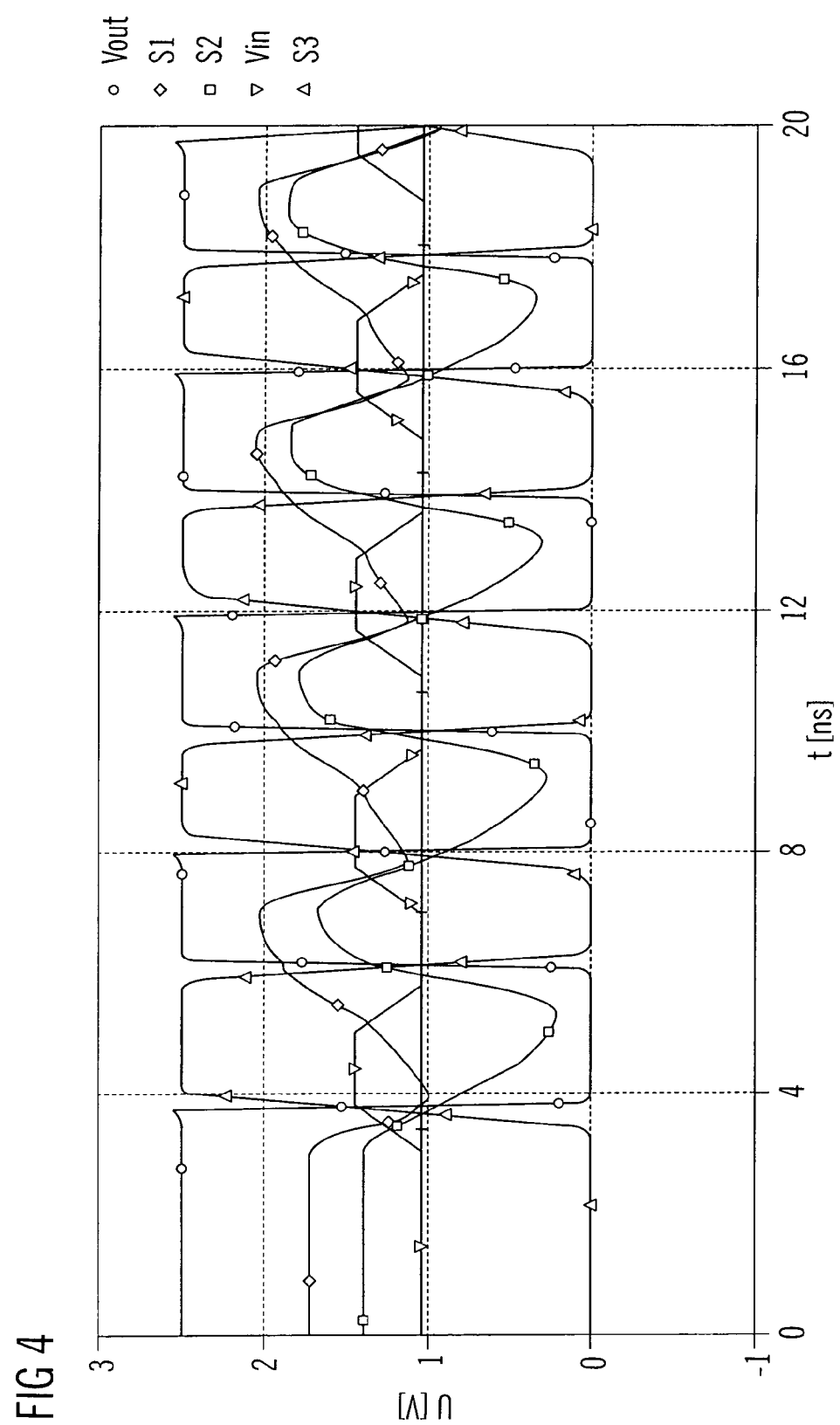
FIG. 4 depicts a sixth example of a signal state diagram of the integrated circuit according to the invention.

FIG. 4 depicts the signal profiles of the integrated semiconductor memory according to the invention with a lowering of the reference voltage Vref to the low signal level of the input signal Vin of 1.05 V. Here, too, it is evident that the output signal Vout can follow the profile of the input signal, whereas it is highly probable that this would not be the case with the use of a conventional differential amplifier circuit. It shall be pointed out as a further advantage that the resistance value of the drain-source path of the controllable resistor 22 of the second amplifier circuit 20 is lowered as a result of the low level of the reference signal Vref. The second control signal S2 can thus assume a higher level than if the level of the reference signal corresponded to the level of the DC component of the input signal. The higher level of the second control signal S2 has the effect that the resistance value of the drain-source path of the second transistor 32 of the third amplifier circuit 30 is controlled with lower resistance than is the case if the level of the reference signal corresponds with the level of the DC component of the input signal. The reference potential VSS can thus be transferred better to the output terminal A30 of the third amplifier circuit.

Figure 5:
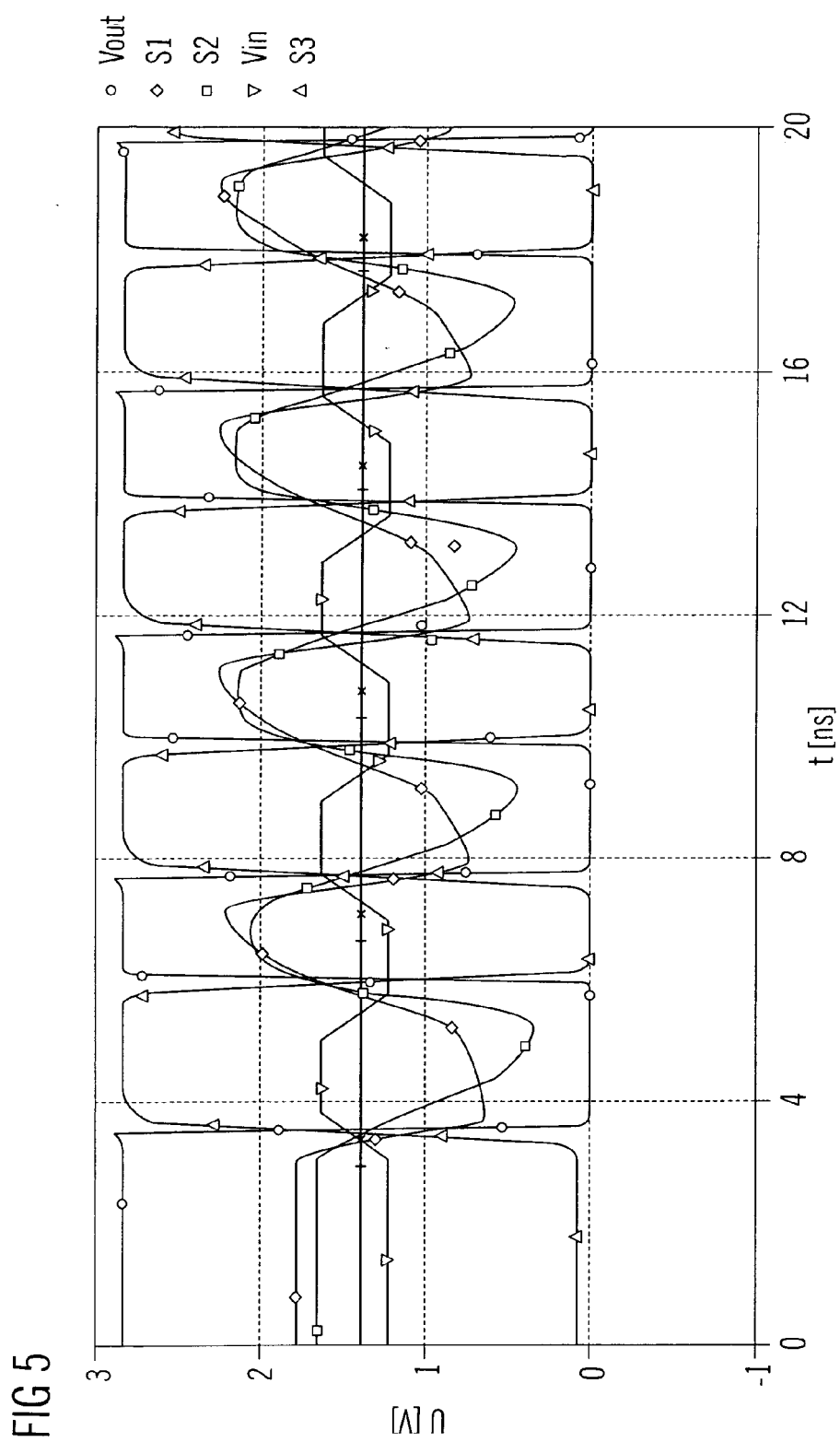
FIG. 5 depicts a seventh example of a signal state diagram of the integrated circuit according to the invention.

FIG. 5 depicts the signal profiles when the integrated circuit is operated at a voltage level of the supply voltage of 2.8 V and a raised level of the reference voltage Vref to 1.4 V. In this overvoltage operation, too, the profile of the output signal can follow the profile of the input signal.

Figure 6:
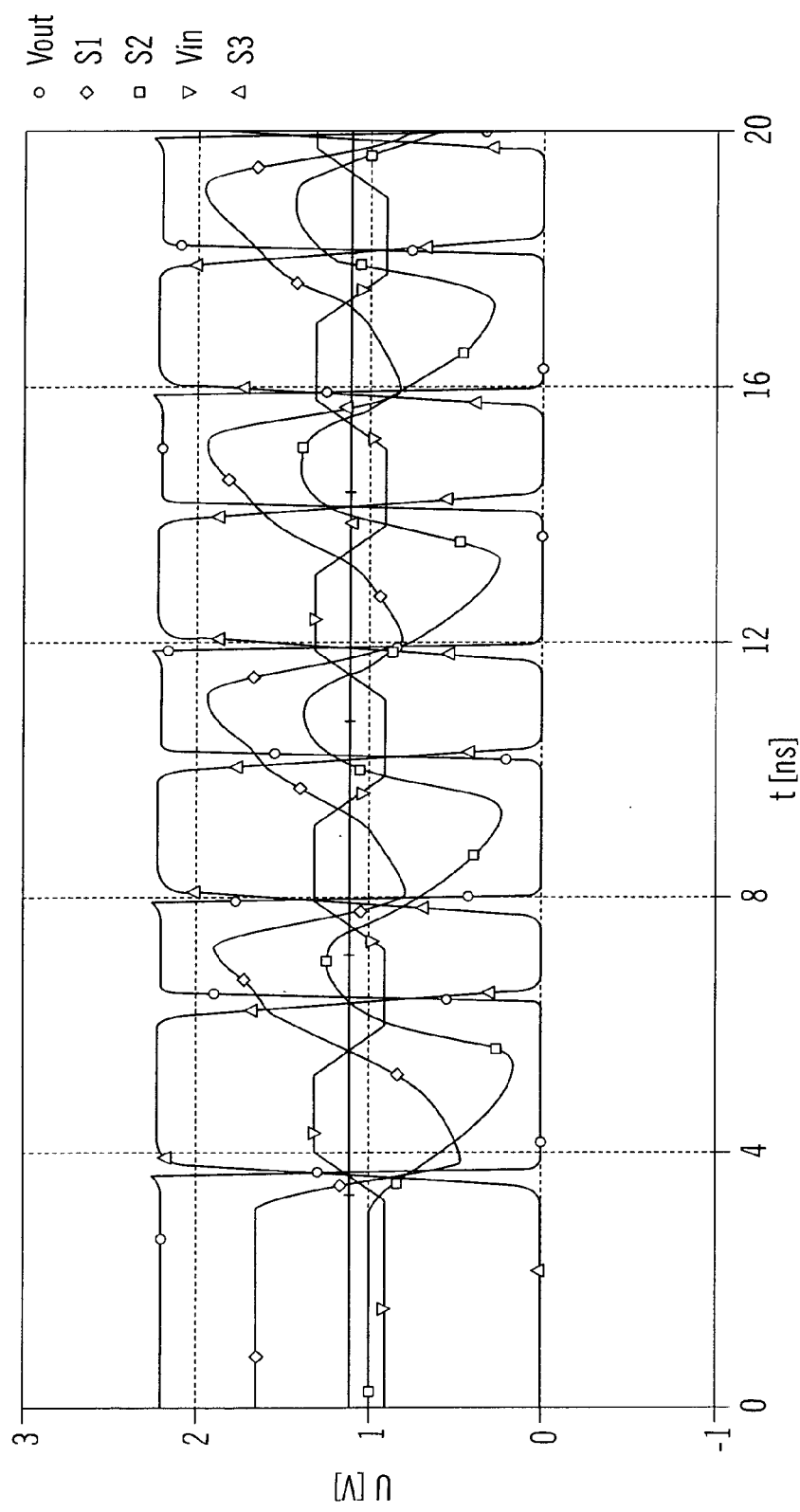
FIG. 6 depicts a eighth example of a signal state diagram of the integrated circuit according to the invention.

FIG. 6 depicts the signal profiles when the integrated circuit according to the invention is operated at a low supply voltage of 2.2 V and a lowered level of the reference voltage to 1.1 V. In this undervoltage operation of the integrated circuit, too, the output signal can follow the profile of the input signal.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols: | |
| --- | --- |
| 1 | Current mirror as active load |
| 2 | Current mirror as current source |
| 10 | First amplifier circuit |
| 11 | Transistor |
| 12 | Controllable resistor |
| 13, 14 | Resistor |
| 20 | Second amplifier circuit |
| 21 | Transistor |
| 22 | Controllable resistor |
| 23, 24 | Resistor |
| 30 | Third amplifier circuit |
| 31, 32 | Controllable resistor |
| 40 | Inverter circuit |
| 41, 42 | Switching transistor |
| A | Output terminal |
| BA | Terminal for application of the reference potential |
| D | Drain terminal |
| E | Input terminal |
| G | Gate terminal |
| S | Source terminal |
| S1 | First control signal |
| S2 | Second control signal |
| S3 | Third control signal |

-continued

List of reference symbols:

| | |
|---|---|
| T | Transistor |
| VA | Terminal for application of the supply potential |
| VDD | Supply potential |
| Vin | Input signal |
| Vout | Output signal |
| Vref | Reference signal |
| VSS | Reference potential |

What is claimed:

1. An integrated circuit comprising:
a first input terminal that applies an input signal with a high level and a low level, the input signal having a DC component;
a second input terminal that applies a reference signal with a constant level;
a first amplifier circuit that generates a first control signal and includes a first input terminal connected to the first input terminal that applies the input signal and a second input terminal connected to the second input terminal that applies the reference signal;
a second amplifier circuit that generates a second control signal and includes a first input terminal connected to the first input terminal that applies the input signal and a second input terminal connected to the second input terminal that applies the reference signal; and
a third amplifier circuit including a first controllable resistor that is controlled by the first control signal and a second controllable resistor that is controlled by the second control signal;
wherein:
the first and second amplifier circuits are configured such that, upon driving with the high level of the input signal, the first amplifier circuit generates the first control signal at one level, so that the first controllable resistor of the third amplifier circuit is controlled at a low-resistance level, and the second amplifier circuit generates the second control signal at one level, so that the second controllable resistor of the third amplifier circuit is controlled at a high-resistance level, when the constant level of the reference signal is between the high and low levels of the input signal;
the first and second amplifier circuits are further configured such that, upon driving with the low level of the input signal, the first amplifier circuit generates the first control signal at another level, so that the first controllable resistor of the third amplifier circuit is controlled at a high-resistance level, and the second amplifier circuit generates the second control signal at another level, so that the second controllable resistor of the third amplifier circuit is controlled at a low-resistance level, when the constant level of the reference signal is between the high and low levels of the input signal;
the first amplifier circuit comprises a controllable resistor including a control terminal that sets a resistance value,
the control terminal of the controllable resistor of the first amplifier circuit is connected to the second input terminal that applies the reference signal;
the controllable resistor of the first amplifier circuit is configured to have a first resistance value when the reference signal has a level of the DC component of the input signal; and the controllable resistor of the first amplifier circuit is further configured to have a second resistance value when the reference signal exceeds the level of the DC component of the input signal, with the second resistance value lying below the first resistance value.

2. The integrated circuit of claim 1, wherein:
upon the driving with the high level of the input signal, the first and second amplifier circuits are further configured such that the first amplifier circuit generates the first control signal at a first level, so that the first controllable resistor of the third amplifier circuit is controlled at a low-resistance level, and the second amplifier circuit generates the second control signal at a first level, so that the second controllable resistor of the third amplifier circuit is controlled at a high-resistance level, when the level of the reference signal corresponds with the level of the DC component of the input signal; and
upon the driving with the low level of the input signal, the first and second amplifier circuits are further configured such that the first amplifier circuit generates the first control signal at a second level, so that the first controllable resistor of the third amplifier circuit is controlled at a high-resistance level, and the second amplifier circuit generates the second control signal at a second level, so that the second controllable resistor of the third amplifier circuit is controlled at a low-resistance level, when the level of the reference signal corresponds with the level of the DC component of the input signal.

3. The integrated circuit of claim 2, wherein, upon the driving with the high level of the input signal, the first amplifier circuit is further configured to generate the first control signal at a level below the first level of the first control signal when the level of the reference signal is above the level of the DC component of the input signal.

4. The integrated circuit of claim 2, wherein, upon the driving with the low level of the input signal, the second amplifier circuit is further configured to generate the second control signal at a level above the second level of the second control signal when the level of the reference signal is below the level of the DC component of the input signal.

5. The integrated circuit of claim 1, further comprising:
a terminal that applies a supply potential; and
a terminal that applies a reference potential;
wherein each of the first and second amplifier circuits is connected between the terminal that applies the supply potential and the terminal that applies the reference potential.

6. The integrated circuit of claim 1, wherein:
the third amplifier circuit includes an output terminal;
the first controllable resistor of the third amplifier circuit is connected between a terminal that applies a supply potential and the output terminal of the third amplifier circuit;
the first controllable resistor of the third amplifier circuit includes a control terminal to which the first control signal is fed;
the second controllable resistor of the third amplifier circuit is connected between a terminal that applies a reference potential and the output terminal of the third amplifier circuit; and
the second controllable resistor of the third amplifier circuit includes a control terminal to which the second control signal is fed.

7. The integrated circuit of claim 1, wherein:
the first amplifier circuit further includes a first transistor with a drain terminal that generates the first control signal, a gate terminal and a source terminal;
the gate terminal of the first transistor of the first amplifier circuit is connected to the first input terminal that applies the input signal; and
the drain terminal of the first transistor of the first amplifier circuit is connected to the control terminal of the first controllable resistor of the third amplifier circuit.

8. The integrated circuit of claim 7, wherein:
the first amplifier circuit further includes a first resistor and a second resistor that set an operating point of the first amplifier circuit;
the first resistor of the first amplifier circuit is connected between a terminal that applies a supply potential and the drain terminal of the first transistor of the first amplifier circuit;
the second resistor of the first amplifier circuit is connected to a terminal that applies a reference potential; and
the controllable resistor of the first amplifier circuit is connected between the source terminal of the first transistor of the first amplifier circuit and the second resistor of the first amplifier circuit.

9. The integrated circuit of claim 8, wherein each of the first transistor of the first amplifier circuit and the controllable resistor of the first amplifier circuit configured as an n-channel field effect transistor.

10. The integrated circuit of claim 1, wherein:
the second amplifier circuit further includes a first transistor with a drain terminal that generates the second control signal, a gate terminal and a source terminal;
the gate terminal of the first transistor of the second amplifier circuit is connected to the first input terminal that applies the input signal; and
the drain terminal of the first transistor of the second amplifier circuit is connected to the control terminal of the second controllable resistor of the third amplifier circuit.

11. The integrated circuit of claim 1, wherein:
the second amplifier circuit further includes a controllable resistor with a control terminal that sets a resistance value;
the control terminal of the controllable resistor of the first amplifier circuit is connected to the second input terminal that applies the reference signal;
the controllable resistor of the second amplifier circuit is configured to have a first resistance value when the reference signal is the level of the DC component of the input signal; and
the controllable resistor of the second amplifier circuit is configured to have a second resistance value when the reference signal is below the level of the DC component of the input signal, the second resistance value being below the first resistance value.

12. The integrated circuit of claim 11, wherein:
the second amplifier circuit further includes a first resistor and a second resistor to set an operating point of the second amplifier circuit;
the first resistor of the second amplifier circuit is connected between a terminal that applies a reference potential and the drain terminal of the first transistor of the first amplifier circuit;
the second resistor of the second amplifier circuit is connected to a terminal that applies a supply potential; and
the controllable resistor of the second amplifier circuit is connected between the source terminal of the first transistor of the second amplifier circuit and the second resistor of the second amplifier circuit.

13. The integrated circuit of claim 12, wherein each of the first transistor of the second amplifier circuit and the controllable resistor of the second amplifier circuit is configured as a p-channel field effect transistor.

14. The integrated circuit of claim 5, further comprising:
an output terminal of the integrated circuit; and
an inverter circuit;
wherein:
the inverter circuit is connected between the terminal that applies the supply potential and the terminal that applies the reference potential (VSS); and
the output terminal of the third amplifier circuit is connected to the output terminal of the integrated circuit via the inverter circuit.

15. The integrated circuit of claim 1, wherein:
the first controllable resistor of the third amplifier circuit is configured as a p-channel field effect transistor; and
the second controllable resistor of the third amplifier circuit is configured as an n-channel field effect transistor.

16. A method for amplifying an input signal comprising:
providing an input signal with a high level and a low level, the input signal having a DC component;
providing a reference signal with a constant level corresponding to a level of the DC component of the input signal;
providing an integrated circuit comprising a first amplifier circuit including a transistor and a controllable resistor, a second amplifier circuit including a transistor and a controllable resistor, and a third amplifier circuit, wherein a supply potential is fed via a first controllable resistor of the third amplifier circuit and a reference potential is fed via a second controllable resistor of the third amplifier circuit to an output terminal of the third amplifier circuit;
applying the constant level of the reference signal to a second input terminal of the first amplifier circuit to control the controllable resistor of the first amplifier circuit and to a second input terminal of the second amplifier circuit to control the controllable resistor of the second amplifier circuit;
applying the high level of the input signal to a first input terminal of the first amplifier circuit to control the transistor of the first amplifier circuit and to a first input terminal of the second amplifier circuit to control the transistor of the second amplifier circuit;
generating a first control signal at a first level via the first amplifier circuit;
controlling the first controllable resistor of the third amplifier circuit to a low-resistance level upon a driving of the first controllable resistor of the third amplifier circuit with the first level of the first control signal;
generating a second control signal at a first level via the second amplifier circuit;
controlling the second controllable resistor of the third amplifier circuit to a high-resistance level upon a driving of the second controllable resistor of the third amplifier circuit with the first level of the second control signal;
applying the low level of the input signal to the first input terminal of the first amplifier circuit to control the transistor of the first amplifier circuit and to the first input terminal of the second amplifier circuit to control the transistor of the second amplifier circuit;

generating the first control signal at a second level via the first amplifier circuit;

controlling the first controllable resistor of the third amplifier circuit to a high-resistance level upon a driving of the first controllable resistor of the third amplifier circuit with the second level of the first control signal;

generating the second control signal at a second level via the second amplifier circuit; and controlling the second controllable resistor of the third amplifier circuit to a low-resistance level upon a driving of the second controllable resistor of the third amplifier circuit with the second level of the second control signal.

17. A method for amplifying an input signal, comprising:

providing an input signal with a high and a low level, the input signal having a DC component;

providing a reference signal with a constant level that is above a level of the DC component of the input signal;

providing an integrated circuit comprising a first amplifier circuit including a transistor and a controllable resistor, a second amplifier circuit including a transistor and a controllable resistor, and a third amplifier circuit, wherein a supply potential is fed via a first controllable resistor of the third amplifier circuit and a reference potential is fed via a second controllable resistor of the third amplifier circuit to an output terminal of the third amplifier circuit;

applying the constant level of the reference signal to a second input terminal of the first amplifier circuit to control the controllable resistor of the first amplifier circuit and to a second input terminal of the second amplifier circuit to control the controllable resistor of the second amplifier circuit;

applying the high level of the input signal to a first input terminal of the first amplifier circuit to control the transistor of the first amplifier circuit and to a first input terminal of the second amplifier circuit to control the transistor of the second amplifier circuit;

generating a first control signal at a first level via the first amplifier circuit, wherein the first level of the first control signal is below another control signal level of the first control signal that is generated by the first amplifier circuit when the constant level of the reference voltage corresponds with the level of the DC component of the input signal;

controlling the first controllable resistor of the third amplifier circuit to a low-resistance level upon a driving of the first controllable resistor of the third amplifier circuit with the first level of the first control signal;

generating a second control signal at a first level via the second amplifier circuit;

controlling the second controllable resistor of the third amplifier circuit to a high-resistance level upon a driving of the second controllable resistor of the third amplifier circuit with the first level of the second control signal;

applying the low level of the input signal to the first input terminal of the first amplifier circuit to control the transistor of the first amplifier circuit and to the first input terminal of the second amplifier circuit to control the transistor of the second amplifier circuit;

generating the first control signal at a second level via the first amplifier circuit;

controlling the first controllable resistor of the third amplifier circuit to a high-resistance level upon a driving of the first controllable resistor of the third amplifier circuit with the second level of the first control signal;

generating the second control signal at a second level via the second amplifier circuit, wherein the second level of the second control signal is below another control signal level that is generated by the second amplifier circuit when the constant level of the reference signal corresponds with the level of the DC component of the input signal; and controlling the second controllable resistor of the third amplifier circuit to a low-resistance level upon a driving of the second controllable resistor of the third amplifier circuit with the second level of the second control signal.

18. A method for amplifying an input signal, comprising:

providing an input signal with a high and a low level, the input signal having a DC component;

providing a reference signal with a constant level lying below a level of the DC component of the input signal;

providing an integrated circuit comprising a first amplifier circuit including a transistor and a controllable resistor, a second amplifier circuit including a transistor and a controllable resistor, and a third amplifier circuit, wherein a supply potential is fed via a first controllable resistor of the third amplifier circuit and a reference potential is fed via a second controllable resistor of the third amplifier circuit to an output terminal of the third amplifier circuit;

applying the constant level of the reference signal to a second input terminal of the first amplifier circuit to control the controllable resistor of the first amplifier circuit and to a second input terminal of the second amplifier circuit to control the controllable resistor of the second amplifier circuit;

applying the high level of the input signal to a first input terminal of the first amplifier circuit to control the transistor of the first amplifier circuit and to a first input terminal of the second amplifier circuit to control the transistor of the second amplifier circuit, generating a first control signal at a first level via the first amplifier circuit, wherein the first level of the first control signal is above another control signal level that is generated by the first amplifier circuit when the constant level of the reference voltage corresponds with the level of the DC component of the input signal;

controlling the first controllable resistor of the third amplifier circuit to a low-resistance level upon a driving of the first controllable resistor of the third amplifier circuit with the first level of the first control signal;

generating a second control signal with a first level via the second amplifier circuit;

controlling the second controllable resistor of the third amplifier circuit to a high-resistance level upon a driving of the second controllable resistor of the third amplifier circuit with the first level of the second control signal;

applying the low level of the input signal to the first input terminal of the first amplifier circuit to control the transistor of the first amplifier circuit and to the first input terminal of the second amplifier circuit to control the transistor of the second amplifier circuit;

generating the first control signal at a second level via the first amplifier circuit;

controlling the first controllable resistor of the third amplifier circuit to a high-resistance level upon a driving of the first controllable resistor of the third amplifier circuit with the second level of the first control signal;

generating the second control signal with a second level via the second amplifier circuit, wherein the second level of the second control signal is above another control signal level that is generated by the second amplifier circuit when the constant level of the reference signal corresponds with the level of the DC component of the input signal; and controlling the second controllable resistor of the third amplifier circuit to a low-resistance level upon a driving of the second controllable resistor of the third amplifier circuit with the second level of the second control signal.

* * * * *